US012727098B2

(12) United States Patent
Huang et al.

(10) Patent No.: US 12,727,098 B2
(45) Date of Patent: Sep. 1, 2026

(54) DISPLAY DEVICE

(71) Applicant: AUO Corporation, Hsinchu City (TW)

(72) Inventors: Yu-Chun Huang, Hsinchu City (TW); Shu-Te Ho, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 103 days.

(21) Appl. No.: 18/969,290

(22) Filed: Dec. 5, 2024

(65) Prior Publication Data

US 2026/0089855 A1 Mar. 26, 2026

(30) Foreign Application Priority Data

Sep. 26, 2024 (TW) ................................ 113136650

(51) Int. Cl.
*H05K 5/02* (2006.01)

(52) U.S. Cl.
CPC ................................ *H05K 5/0217* (2013.01)

(58) Field of Classification Search
None
See application file for complete search history.

(56) References Cited

U.S. PATENT DOCUMENTS

| | | | | |
|---|---|---|---|---|
| 9,655,267 | B2 * | 5/2017 | Cope | G09F 21/042 |
| 12,031,665 | B2 * | 7/2024 | Seol | A47B 81/06 |
| 2020/0033913 | A1 * | 1/2020 | Yang | H04M 1/0268 |
| 2021/0304642 | A1 * | 9/2021 | Lee | G06F 1/1616 |

FOREIGN PATENT DOCUMENTS

| | | |
|---|---|---|
| CN | 112682670 | 4/2021 |
| CN | 113276783 | 8/2021 |
| CN | 218505776 | 2/2023 |
| CN | 115973045 | 4/2023 |
| CN | 117765818 | 3/2024 |

* cited by examiner

*Primary Examiner* — Xanthia C Relford
(74) *Attorney, Agent, or Firm* — JCIPRNET

(57) ABSTRACT

A display device includes a frame, a flexible display module, a conveying mechanism, and a support mechanism. The flexible display module is bendably folded in a receiving trough and has a lateral side. The conveying mechanism includes a conveying assembly and a chain assembly. The chain assembly is disposed on the flexible display module. The conveying mechanism is disposed in the frame and is adapted to drive the chain assembly to move. The support mechanism is disposed on the frame and is pivotally connected to the lateral side. In a folding mode, the conveying mechanism drives the chain assembly to move in a folding direction so that the flexible display module bendably moves into a receiving trough in the folding direction. In an unfolding mode, the conveying mechanism drives the chain assembly to move in an unfolding direction so that the flexible display module moves out of the receiving trough.

10 Claims, 9 Drawing Sheets

156
156a
156b
157
157a
157b
151
156b
156a
158
C
160
155
153
154
P
157a
159
152
157b
150
151
156b
156a
158
C
160
155
153
154
P
157a
159
152
157b
150
151
156b
156a
158
C
153
160
155
154
P
159
157a
152
157b
150

DISPLAY DEVICE

CROSS-REFERENCE TO RELATED APPLICATION

This application claims the priority benefit of Taiwan application serial no. 113136650, filed on Sep. 26, 2024. The entirety of the above-mentioned patent application is hereby incorporated by reference herein and made a part of this specification.

BACKGROUND

Field of the Invention

The present invention relates to a display device, and in particular to a flexible display device.

Description of Related Art

In the current market, some vehicles are equipped with a center information display provided on the center console between the driver's seat and the passenger's seat, so as to display a variety of information such as vehicle status information and provide an interface for the user to interact with the vehicle. The central information display having a retractable design can be folded and stored in the center console when not in use, thereby gaining more space in the vehicle. If a flexible screen is further adopted in the central information display, space utilization may be facilitated in a more flexible manner.

The flexible screen of a conventional roll-able display may be rolled like a scroll. However, during the rolling process, the display undergoes a large area of stretching or compression and thus requires a large radius of bending, takes up more space, and limits options for material selection. Therefore, a design for central information display that provides a flexible screen and a small radius of bending is desired in the market.

SUMMARY

The disclosure provides a display device with a small radius of bending, convenient folding and unfolding, and being space saving.

A display device of the disclosure includes a frame, a flexible display module, a conveying mechanism, and a support mechanism. The flexible display module is bendably folded in a receiving trough and has a lateral side. The conveying mechanism includes a conveying assembly and a chain assembly. The chain assembly is disposed on the flexible display module. The conveying mechanism is disposed in the frame and is adapted to drive the chain assembly to move. The support mechanism is disposed on the frame and is pivotally connected to the lateral side. When the flexible display module is in a folding mode, the conveying mechanism drives the chain assembly to move in a folding direction so that the flexible display module bendably moves into a receiving trough in the folding direction. When the flexible display module is in an unfolding mode, the conveying mechanism drives the chain assembly to move in an unfolding direction opposite to the folding direction so that the flexible display module moves out of the receiving trough in the unfolding direction.

In an embodiment of the disclosure, the lateral side includes two ends and a central area between the two ends. The flexible display module has a first bending point and two second bending points. The first bending point is located in the central area. The two second bending points move between the two ends along the lateral side during folding or unfolding of the flexible display module relative to the frame.

In an embodiment of the disclosure, the chain assembly includes a carrier assembly and a plurality of chain units. The carrier assembly is disposed on a back side of the flexible display module and includes a plurality of carrier units. The carrier units are rotatably connected in sequence. The chain units are rotatably connected in sequence and are respectfully fixed to the carrier units. Each of the chain units is provided with a driven gear.

In an embodiment of the disclosure, the conveying assembly includes a first gear, a second gear, a conveying belt, and a gear rack. The first gear and the second gear are separated from each other and rotatably disposed on the frame. The conveying belt is fitted on the first gear and the second gear. The gear rack is fixed to the conveying belt, engaged with the driven gear, and is movably disposed on the frame. When the first gear drives the conveying belt to move, the flexible display module is driven by the conveying belt and the gear rack to move into the receiving trough in the folding direction or out of the receiving trough in the unfolding direction.

In an embodiment of the disclosure, the receiving trough has a central axis parallel to the folding direction. The flexible display module moves into or out of the receiving trough symmetrically with respect to the central axis.

In an embodiment of the disclosure, the flexible display module has a first area and a second area. The first area and the second area face away from the frame. The first area and the second area form a display region. An area of the display region is adapted to be changed as the flexible display module is folded or unfolded with respect to the frame.

In an embodiment of the disclosure, the display device further includes a support mechanism. The support mechanism includes a fixing plate, a first axis, a second axis, a third axis, a fourth axis parallel, a first linking member, a second linking member, a third linking member, and a fourth linking member. The fixing plate is fixed to the frame. The first axis, the second axis, the third axis, and the fourth axis are parallel to each other. The first axis and the second axis are fixed on the fixing plate. The third axis and the fourth axis are adapted to move relative to the fixing plate. The first linking member is pivotally connected to the chain assembly, the first axis, and the third linking member. The second linking member is pivotally connected to the chain assembly, the second axis, and the fourth linking member. The third linking member is pivotally connected to the third axis. The fourth linking member is pivotally connected to the fourth axis. The third axis and the fourth axis are adapted to rotate along a circumference, so that the first linking member and the second linking member move close to or distant from each other.

In an embodiment of the disclosure, when the flexible display module is in the folding mode, the first linking member and the second linking member are close to each other. When the flexible display module is in the unfolding mode, the first linking member and the second linking member are distant from each other.

In an embodiment of the disclosure, a line connecting the third axis and the fourth axis passes through a center of the circumference, and a distance between the third axis and the fourth axis is constant.

In an embodiment of the disclosure, the first linking member includes a first sub-linking member and a second sub-linking member. The first sub-linking member is L-shaped and is connected between the chain assembly and the first axis. The second sub-linking member is connected between the first axis and the third linking member. The second linking member includes a third sub-linking member and a fourth sub-linking member. The third sub-linking member is L-shaped and is connected between the chain assembly and the second axis. The fourth sub-linking member is connected between the second axis and the fourth linking member.

In summary, in the display device of the disclosure, the flexible display module is provided with the chain assembly, and the conveying assembly is disposed in the frame and is able to drive the chain assembly to move. When the flexible display module is in the folding mode, the conveying mechanism drives the chain assembly to move in the folding direction, so that the flexible display module bendably moves into the receiving trough, and the flexible display module is folded in half in the receiving trough. When the flexible display module is in the unfolding mode, the conveying mechanism drives the chain assembly to move in the unfolding direction so that the flexible display module moves out of the receiving trough. This design combines sliding and folding mechanisms, allowing not only convenient folding and unfolding but also a local and smaller area of stretching or compression when the flexible display module is bending, thereby effectively reducing the bending radius of the display device and saving space.

DESCRIPTION OF THE EMBODIMENTS

Figure 1A:
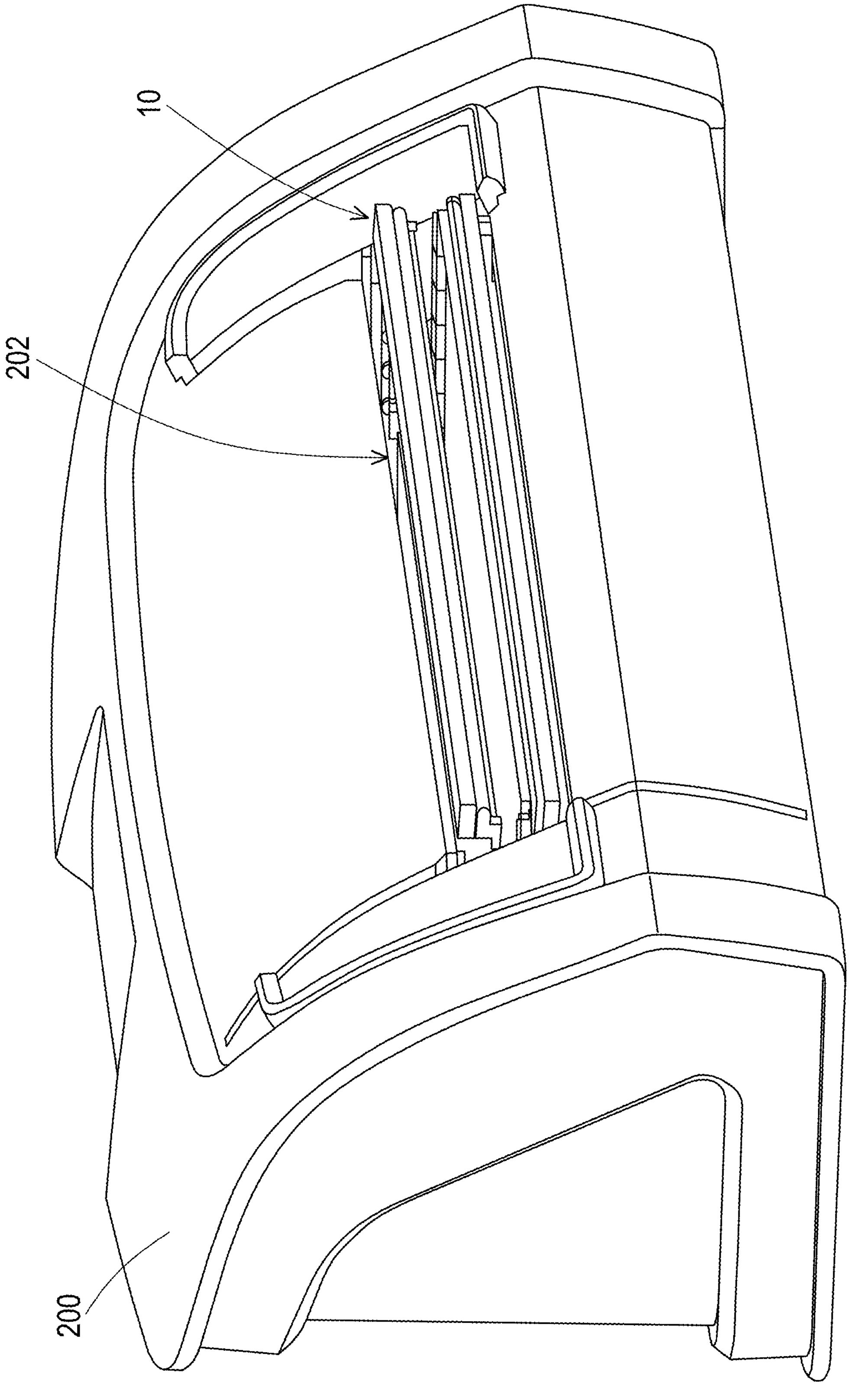
FIG. 1A is a schematic diagram of a display device in a folding mode according to an embodiment of the disclosure.
Figure 1B:
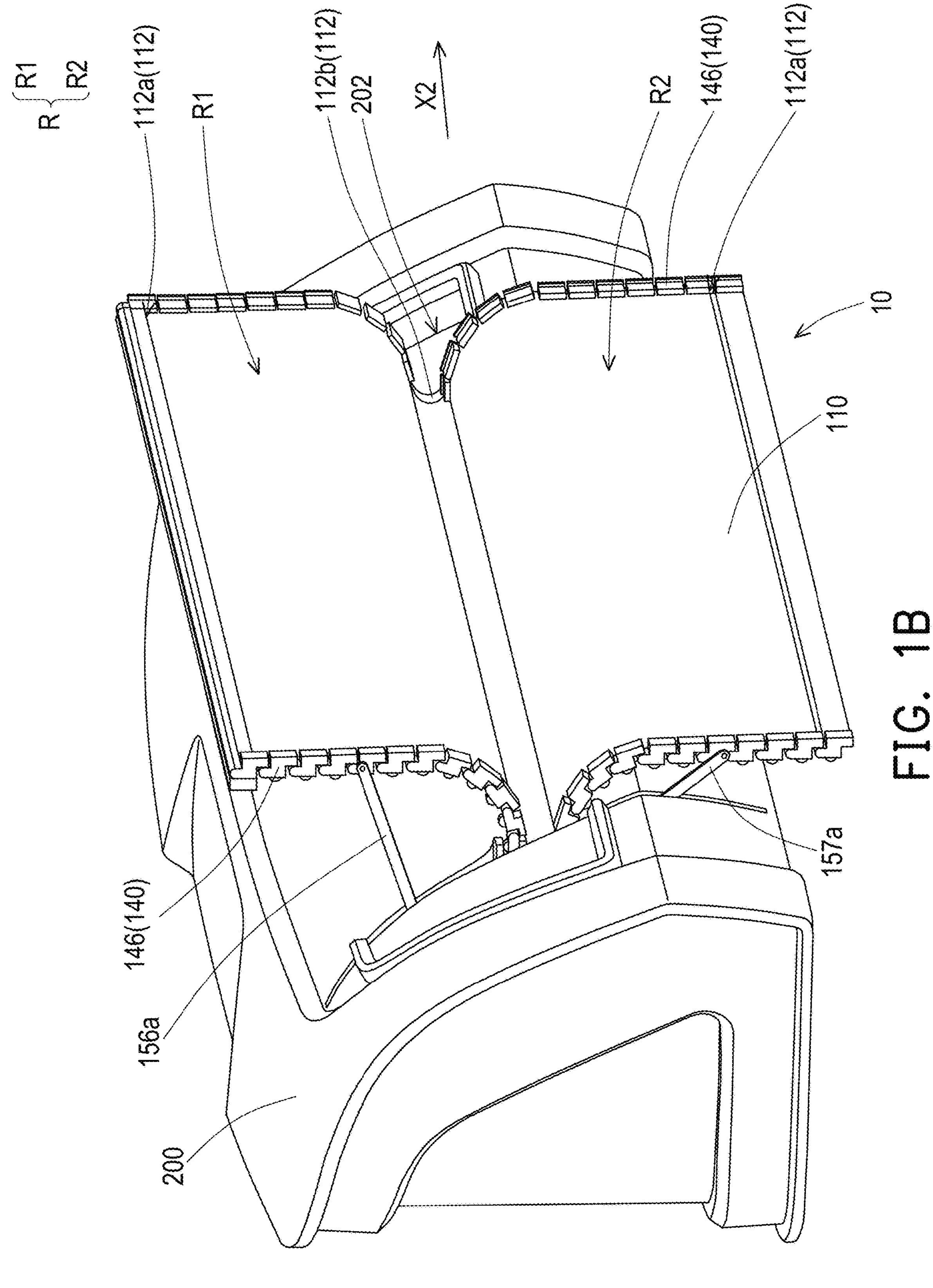
FIG. 1B is a schematic diagram of the display device of FIG. 1A in the unfolding mode.
Figure 1C:
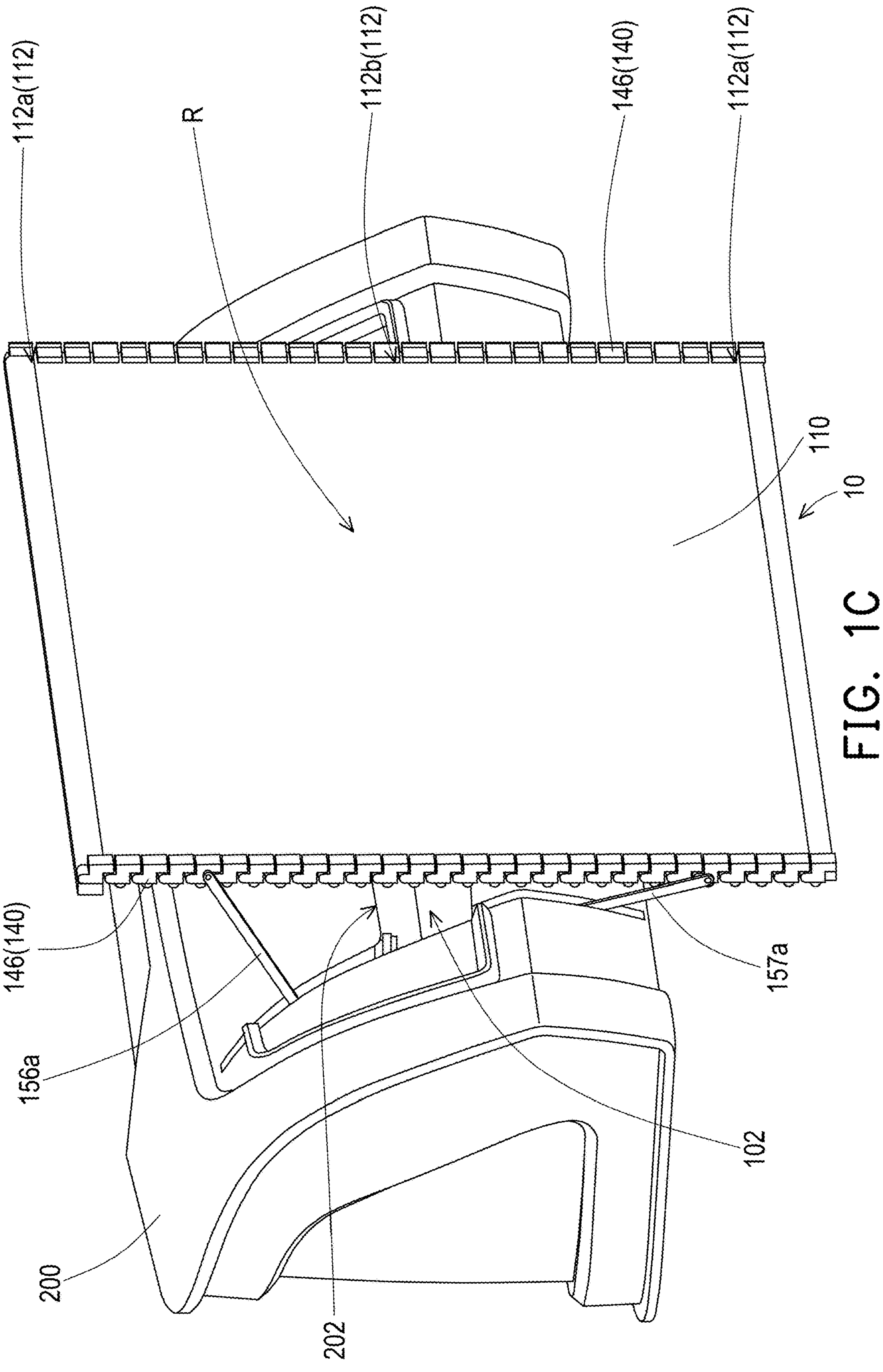
FIG. 1C is a schematic diagram of the display device of FIG. 1A when in an unfolding mode and being fully unfolded.

FIG. 1A is a schematic diagram of a display device in a folding mode according to an embodiment of the disclosure. FIG. 1B is a schematic diagram of the display device of FIG. 1A in the unfolding mode. FIG. 1C is a schematic diagram of the display device of FIG. 1A when in an unfolding mode and being fully unfolded.

Referring to FIG. 1A to FIG. 1C, a display device 10 in this embodiment is, for example, the center information display (CID) of a vehicle, and is disposed between the driver's seat and the passenger's seat and is allowed to display, for example, vehicle status information, but the information displayed is not limited thereto. The display device 10 may further include a display interface to allow a user to interact with the vehicle or functions integrated with the vehicle, such as navigation or audio or video functions.

When the display device 10 is not used by the user, a folding mode of the display device 10 may be activated, so that the display device 10 may be stored in a housing 200 of the center console as illustrated in FIG. 1A to save space in the vehicle.

When the user would like to use the display device 10, the display device 10 may enter an unfolding mode as illustrated in FIG. 1B. In this unfolding mode, the display device 10 is moved out of an opening 202 of the housing 200 and gradually extends in the up and down directions, and may be fully unfolded as illustrated in FIG. 1C to provide a great viewing experience. The methods of folding and unfolding the display device 10 will be explained in detail later.

Figure 2:
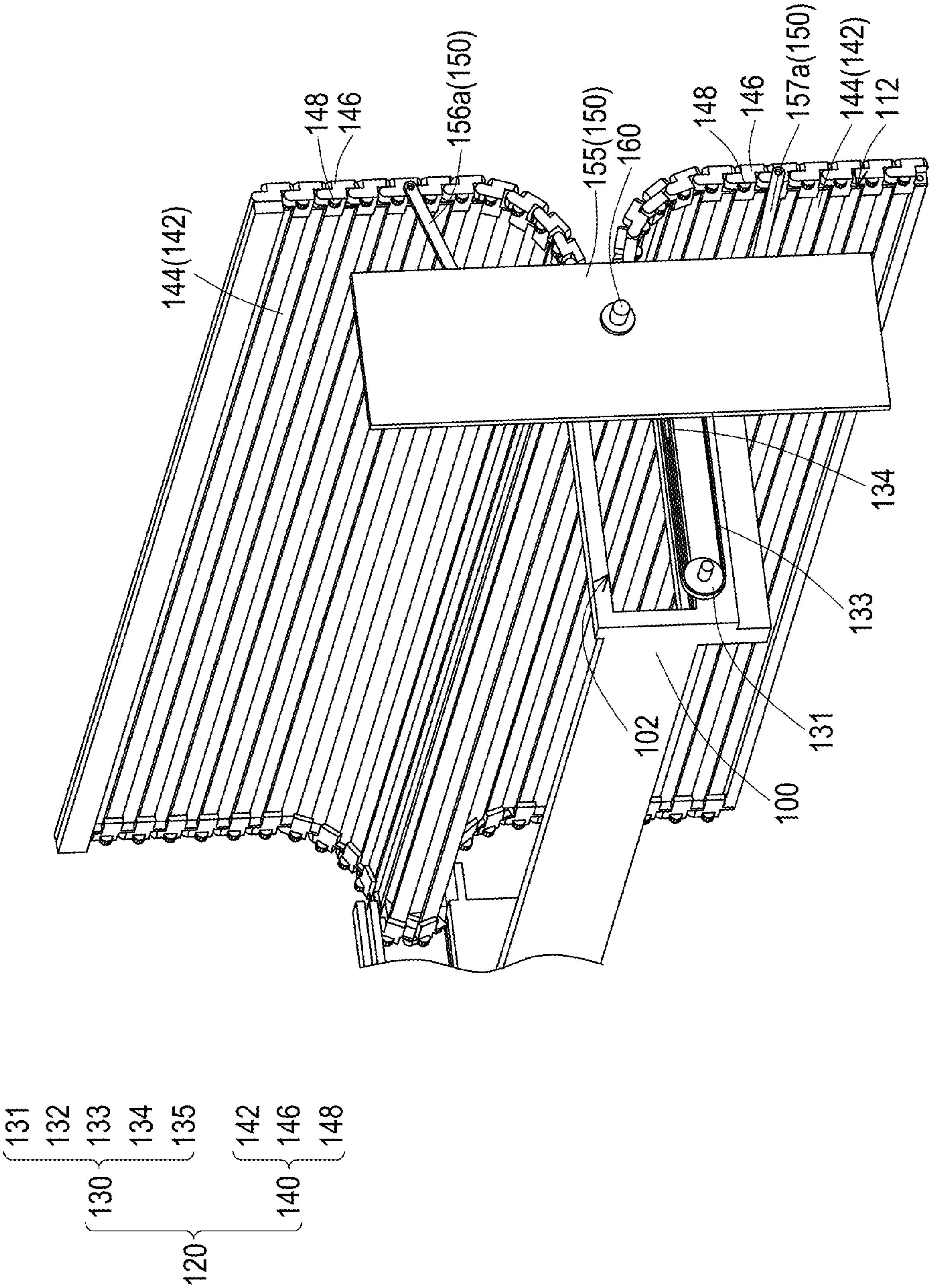
FIG. 2 is a partial view of the display device of FIG. 1B.
Figure 3:
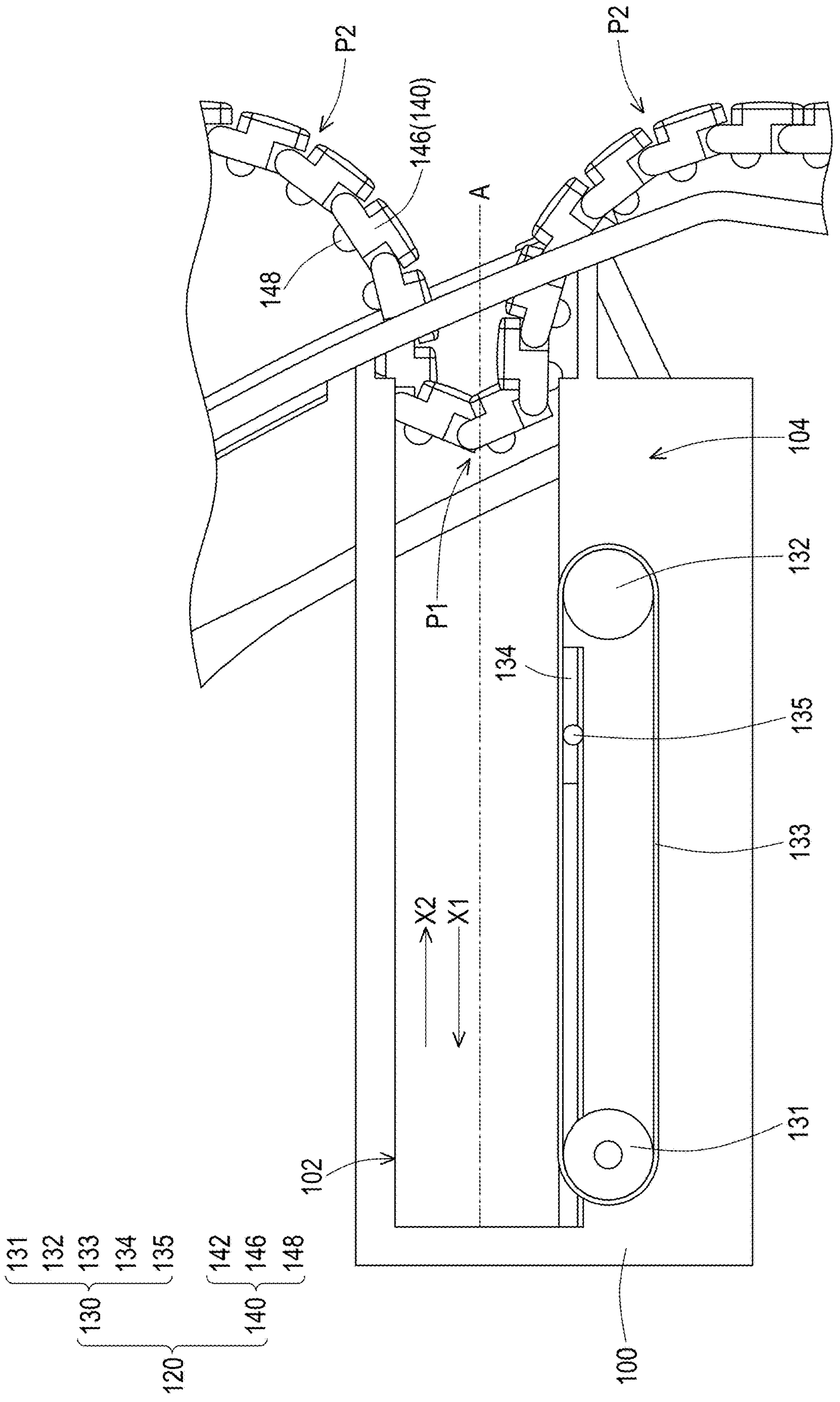
FIG. 3 is a side view of the display device of FIG. 2.

FIG. 2 is a partial view of the display device of FIG. 1B. FIG. 3 is a side view of the display device of FIG. 2. To clearly present the structure of a conveying mechanism 120, a support mechanism 150 is not shown in FIG. 3.

Referring to FIG. 2 and FIG. 3, in this embodiment, the display device 10 includes a frame 100, a flexible display module 110 (FIG. 1B), a conveying mechanism 120, and a support mechanism 150. The frame 100 is disposed in the housing 200 (FIG. 1B) and has a receiving trough 102 corresponding to the opening 202 (FIG. 1B) of the housing 200. The flexible display module 110 is, for example, a flexible display, which may display visual information and may be bendably folded into the receiving trough 102.

The conveying mechanism 120 includes a chain assembly 140 and a conveying assembly 130. The chain assembly 140 is disposed on a lateral side 112 of the flexible display module 110. The conveying assembly 130 is disposed on the frame 100 and is adapted to drive the chain assembly 140 to move. The support mechanism 150 is disposed on the frame 100 and is pivotally connected to the lateral side 112 of the flexible display module 110.

Referring to FIG. 3, when the flexible display module 110 is in the folding mode, the conveying mechanism 120 drives the chain assembly 140 to move in a folding direction X1, so that the flexible display module 110 bendably moves into the receiving trough 102 in the folding direction X1.

Further, the receiving trough 102 has a central axis A parallel to the folding direction X1, and the flexible display module 110 may move into the receiving trough 102 symmetrically with respect to the central axis A. When the flexible display module 110 completely enters the receiving trough 102, the flexible display module 110 is folded in the receiving trough 102 in half to go into a state of storage, as illustrated in FIG. 1A, thereby saving space in the vehicle.

When the flexible display module 110 is in the unfolding mode, the conveying mechanism 120 drives the chain assembly 140 to move in an folding direction X2 opposite to the folding direction X1, so that the flexible display module 110 moves out of the receiving trough 102 in the folding direction X2 and symmetrically with respect to central axis A, going into a state of unfolding, as illustrated in FIG. 1B or FIG. 1C, so that the user may view the image displayed by the flexible display module 110 in a convenient manner.

In addition, the support mechanism 150 (FIG. 2) may support the flexible display module 110, so that the flexible display module 110 may extend perpendicularly to the unfolding direction X2, so as to support and maintain the shape of the flexible display module 110. The support mechanism 150 will be further introduced later.

Referring to FIG. 1B and FIG. 3, in this embodiment, the lateral side 112 of the flexible display module 110 includes two ends 112$a$ and a central area 112$b$ between the two ends 112$a$. The flexible display module 110 generates three bending points when being bent, including a first bending point P1 (FIG. 3) and two second bending points P2 (FIG. 3).

The first bending point P1 is located in the central area 112$b$ and always stays in place, and the two second bending points P2 are located in mirror symmetry with respect to the central axis A. When the flexible display module 110 is folded or unfolded relative to the frame 100, the two second bending points P2 move between the two ends 112$a$ along the lateral side 112.

For example, when the user activates the folding mode, the flexible display module 110 gradually enters the receiving trough 102, and the two second bending points P2 gradually move toward the two ends 112$a$ of the lateral side 112 of the flexible display module 110.

When the user activates the unfolding mode, the flexible display module 110 gradually moves out of the receiving trough 102, and the two second bending points P2 gradually move toward the central area 112$b$ of the lateral side 112 of the flexible display module 110. If the flexible display module 110 is unfolded to the state shown in FIG. 1C, the first bending point P1 and the second bending points P2 no longer exist since the flexible display module 110 is fully unfolded with no bending.

Based on the design described above, the display device 10 in this embodiment combines both the structure features of a sliding display and a foldable display. Specifically, in the unfolding mode, the flexible display module 110 may slide in or out of the receiving trough 102 relative to the frame 100, so requiring extremely small space for expansion. In the folding mode, the flexible display module 110 may be folded in half in the receiving trough 102 of the frame 100, thereby effectively saving storage space. Moreover, the flexible display module 110 undergoes a local and smaller area of stretching or compression when in bending. Compared with a conventional roll-able display, the radius of bending for the display device 10 may be reduced, further saving space and allowing the material selection with more flexibility.

In addition, as illustrated in FIG. 1B, the flexible display module 110 has a first region R1 and a second region R2. The first region R1 and the second region R2 face away from the frame 100 and form a display region R for displaying images. The area of the display region R is adapted to be changed as the flexible display module 110 is folded or unfolded with respect to the frame 100.

For example, when the flexible display module 110 gradually transitions from the state of FIG. 1B to the state of FIG. 1C, the area of the display region R will gradually increase. Therefore, when using a function (such as an alarm clock) that does not require a large display area, only a portion of the flexible display module 110 needs to be unfolded to display the corresponding image screen, thus leading to space efficiency.

Note that FIG. 2 presents one support mechanism 150, but the number of support mechanism 150 is not limited thereto. The display device 10 may include two support mechanisms 150 located on the opposite sides of the frame 100, respectively.

Figure 4:
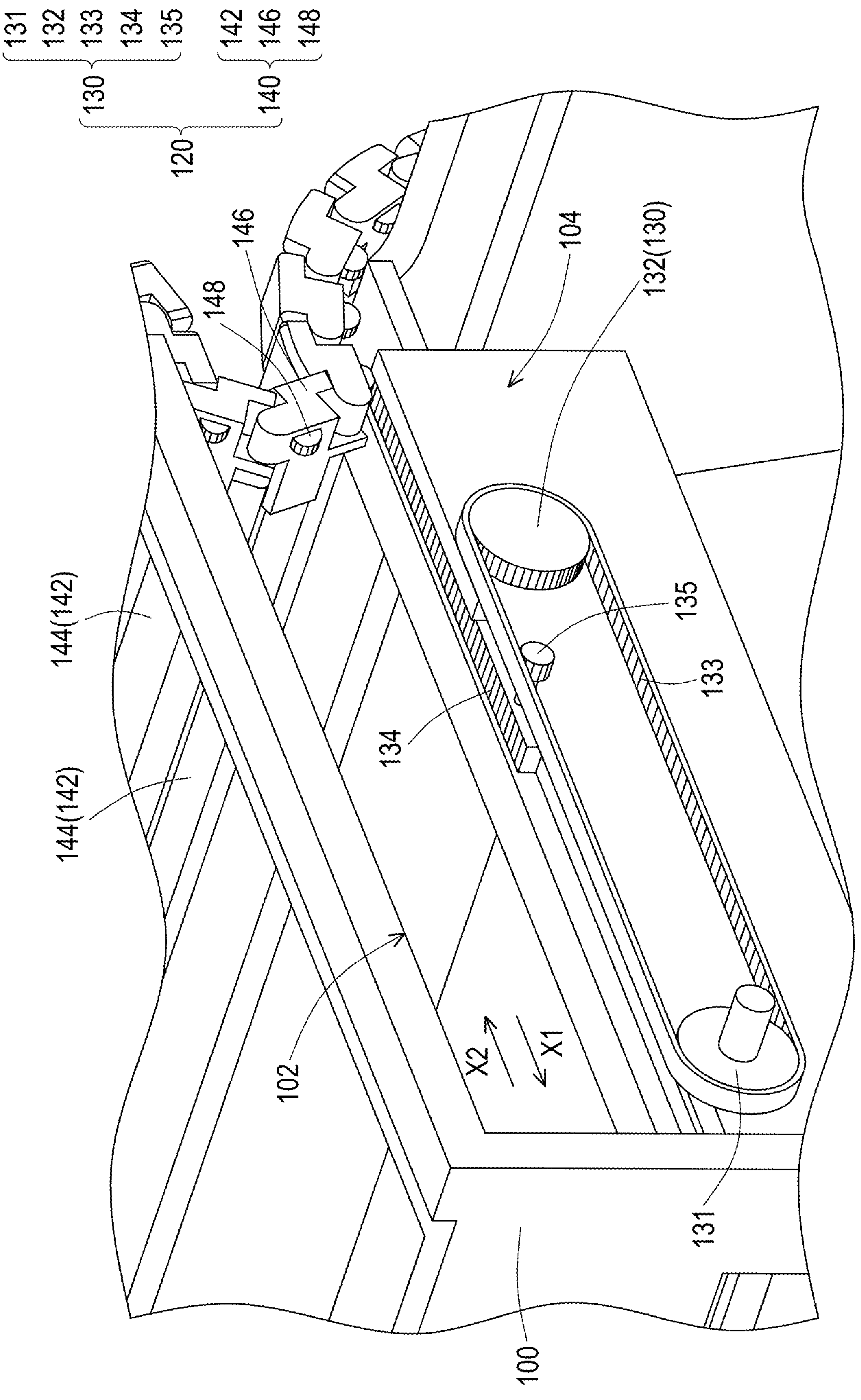
FIG. 4 is a partial enlarged view of the display device in FIG. 2.
Figure 5:
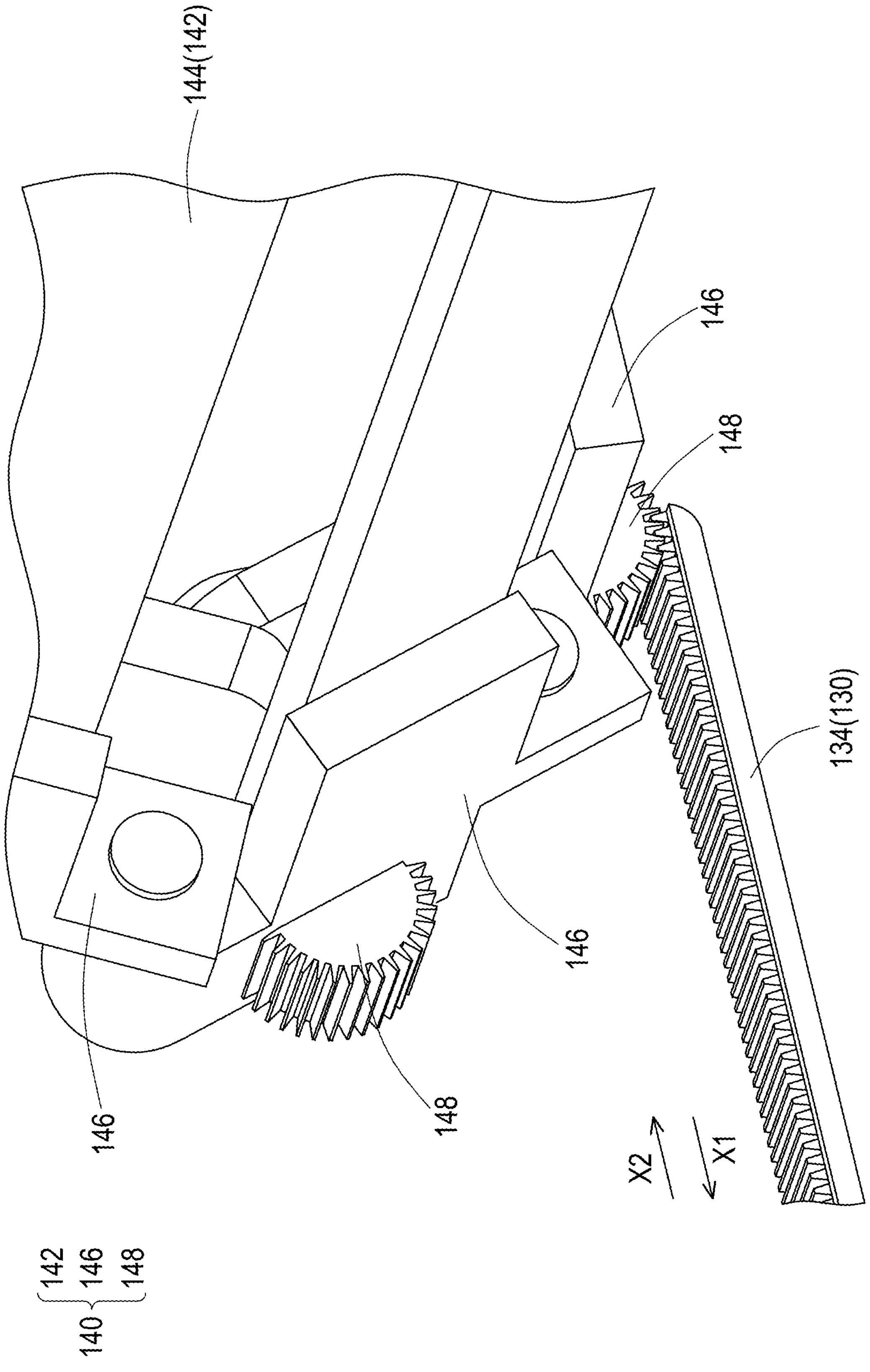
FIG. 5 is a schematic diagram of a gear rack and a chain assembly of FIG. 4.

The structure and operating mechanism of the conveying mechanism 120 will be further explained below. FIG. 4 is a partial enlarged view of the display device in FIG. 2. FIG. 5 is a schematic diagram of a gear rack and a chain assembly of FIG. 4. To clearly present the structure of the conveying mechanism 120, the support mechanism 150 is not shown in FIG. 4.

Referring to FIG. 4 and FIG. 5, the chain assembly 140 of the conveying mechanism 120 includes a carrier assembly 142 and a plurality of chain units 146. The carrier assembly 142 is disposed on a back side of the flexible display module 110 (FIG. 1B) and includes a plurality of carrier units 144. These carrier units 144 are, for example, long-plate shaped, and are rotatably connected in sequence to support the flexible display module 110. These chain units 146 are rotatably connected in sequence and are respectively fixed to the carrier units 144. Each of the chain units 146 is provided with a driven gear 148, and the driven gear 148 is fixed to the corresponding chain unit 146 and does not rotate.

On the other hand, the conveying assembly 130 of the conveying mechanism 120 includes a first gear 131, a second gear 132, a conveying belt 133, a gear rack 134, and a fixing member 135. The first gear 131 and the second gear 132 are separated from each other and are rotatably disposed on a side 104 of the frame 100, the first gear 131 may be connected to a first power source such as a motor, and the first power source is adapted to drive the first gear 131 to rotate.

The conveying belt 133 is fitted on the first gear 131 and the second gear 132. The gear rack 134 is fixed to the fixing member 135. The gear rack 134 may be engaged with the driven gear 148 and fixed to the conveying belt 133 through the fixing member 135, thereby being movably disposed in the receiving trough 102 of the frame 100. The fixing member 135 is, for example, a gear, which may be engaged with and fixed to the conveying belt 133, but the type of the fixing member 135 is not limited thereto.

Further, when the first gear 131 is driven by the first power source, the first gear 131 drives the conveying belt 133 to move, and the gear rack 134 moves in the folding direction X1 or folding direction X2 along with the conveying belt 133. Meanwhile, as illustrated in FIG. 5, since the driven gear 148 of the corresponding chain unit 146 is engaged with the gear rack 134, the chain unit 146 may be driven by the gear rack 134 and move in the folding direction X1 or the folding direction X2.

In other words, in this embodiment, the flexible display module 110 may bendably move into the receiving trough 102 in the folding direction X1 or out of the receiving trough 102 in unfolding direction X2, with the cooperation of the conveying belt 133, the gear rack 134, and the driven gear 148, facilitating excellent folding or unfolding of the flexible display module 110.

In addition, the first gear 131, the second gear 132, the conveying belt 133, the gear rack 134, the driven gear 148, and the fixing member 135 are schematically shown in FIG. 3 and FIG. 4. These components are all provided with teeth in this embodiment. For example, FIG. 5 illustrates the teeth of the gear rack 134 and the driven gear 148. The disclosure does not limit the shape, quantity and size of the teeth of these components, so long as the above-mentioned purpose for conveying is achieved.

Figure 6:
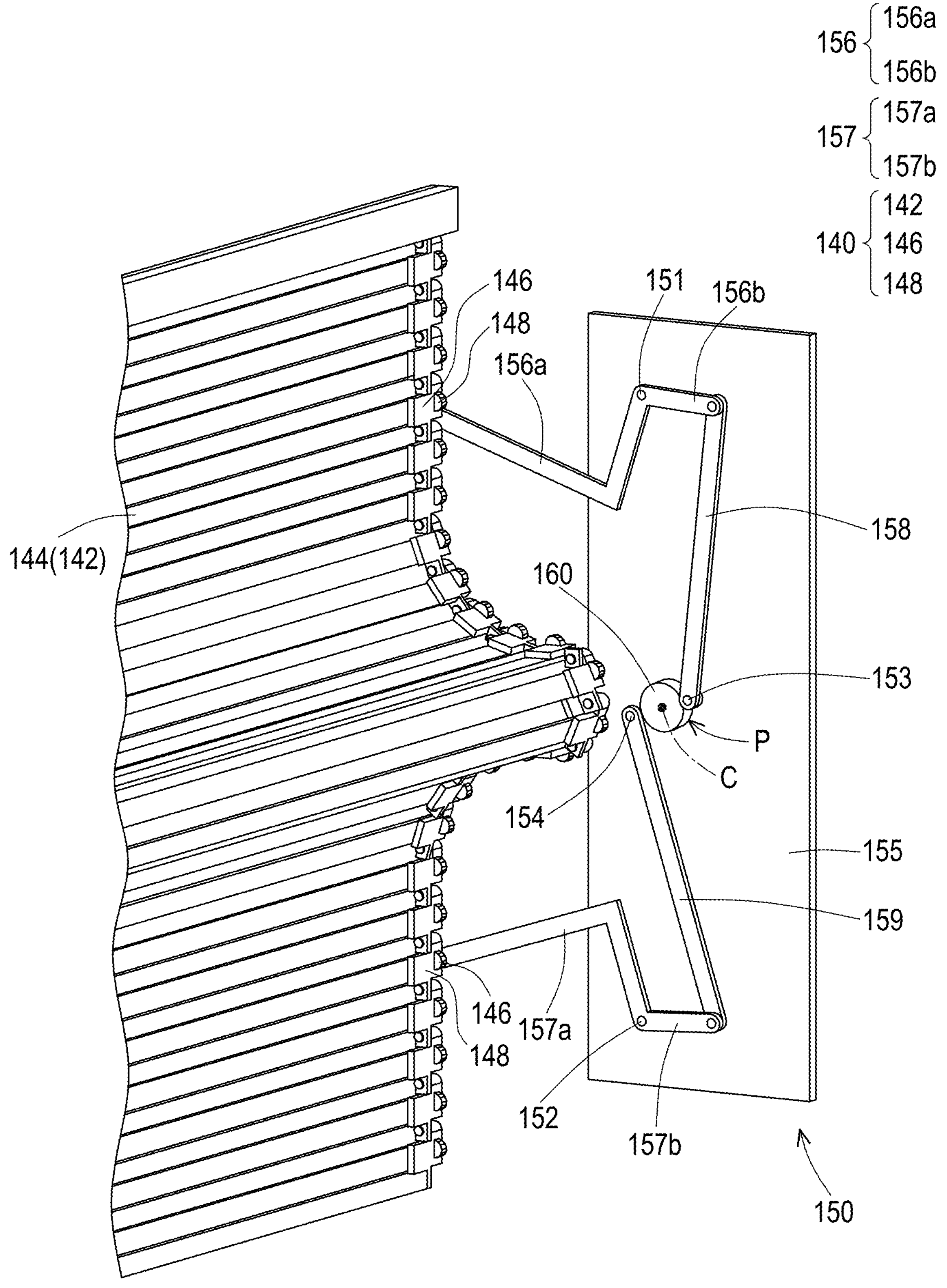
FIG. 6 is a schematic diagram of the display device in FIG. 2 from another angle of view.

Next, the structure of the support mechanism 150 will be further explained. FIG. 6 is a schematic diagram of the display device in FIG. 2 from another angle of view. To clearly present the structure of the support mechanism 150, the frame 100 and conveying assembly 130 are not shown in FIG. 6.

Referring to FIG. 5 and FIG. 6, the support mechanism 150 in this embodiment includes a fixing plate 155, a rotating member 160, a plurality of axes, and a plurality of linking members. The fixing plate 155 is fixed to the frame 100 (FIG. 2). The rotating member 160 is rotatably disposed on the fixing plate 155 and is connected to a second power source such as a motor, and the second power source is adapted to drive the rotating member 160 to rotate.

The plurality of axes includes a first axis 151, a second axis 152, a third axis 153, and a fourth axis 154 that are parallel to each other. The first axis 151 and the second axis 152 are fixed on the fixing plate 155, and the rotating member 160 is located between the first axis 151 and the second axis 152. The third axis 153 and the fourth axis 154 are located on the opposite sides of the rotating member 160 and may move relative to the fixing plate 155 as the rotating member 160 rotates. A line connecting the third axis 153 and the fourth axis 154 passes through the center C of a circumference P of the rotating member 160, and the distance between the third axis 153 and the fourth axis 154 is constant.

In this embodiment, the plurality of linking members is located on one side of the fixing plate 155 and faces the frame 100, and includes a first linking member 156, a second linking member 157, a third linking member 158, and a fourth linking member 159. The first linking member 156 is pivotally connected to the chain assembly 140, the first axis 151, and the third linking member 158.

Specifically, the first linking member 156 includes a first sub-linking member 156*a* and a second sub-linking member 156*b*. The first sub-linking member 156*a* is L-shaped and is connected between the corresponding chain unit 146 of the chain assembly 140 and the first axis 151. The second sub-linking member 156*b* is connected between the first axis 151 and the third linking member 158. The first sub-linking member 156*a* and the second sub-linking member 156*b* are integrally formed.

Similarly, the second linking member 157 is pivotally connected to the chain assembly 140, the second axis 152, and the fourth linking member 159. Specifically, the second linking member 157 includes a third sub-linking member 157*a* and a fourth sub-linking member 157*b*. The third sub-linking member 157*a* is L-shaped and is connected to another chain unit 146 of the chain assembly 140 and the second axis 152. The fourth sub-linking member 157*b* is connected between the second axis 152 and the fourth linking member 159. The third sub-linking member 157*a* and the fourth sub-linking member 157*b* are integrally formed.

The end of the third linking member 158 away from the first linking member 156 is pivotally connected to the third axis 153, and the end of the fourth linking member 159 away from the second linking member 157 is pivotally connected to the fourth axis 154. In addition, fasteners may be provided at the pivotal spots between the third linking member 158 and the first linking member 156 and between the fourth linking member 159 and the second linking member 157, so as to ensure a secure pivotal connection.

Figure 7C:
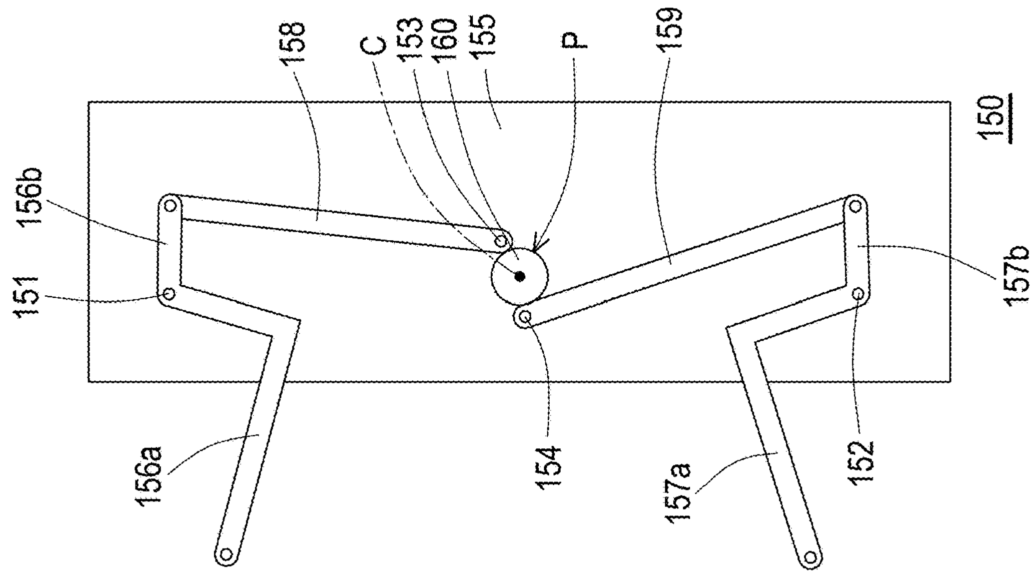
FIG. 7C is a schematic diagram of the support mechanism of FIG. 6 at a third time point in time.
Figure 7B:
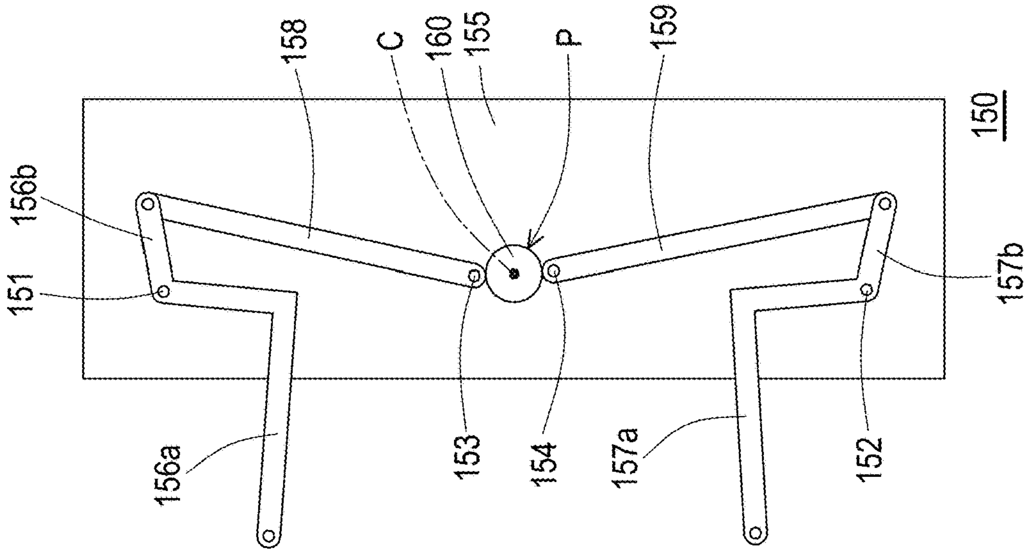
FIG. 7B is a schematic diagram of the support mechanism of FIG. 6 at a second time point in time.
Figure 7A:
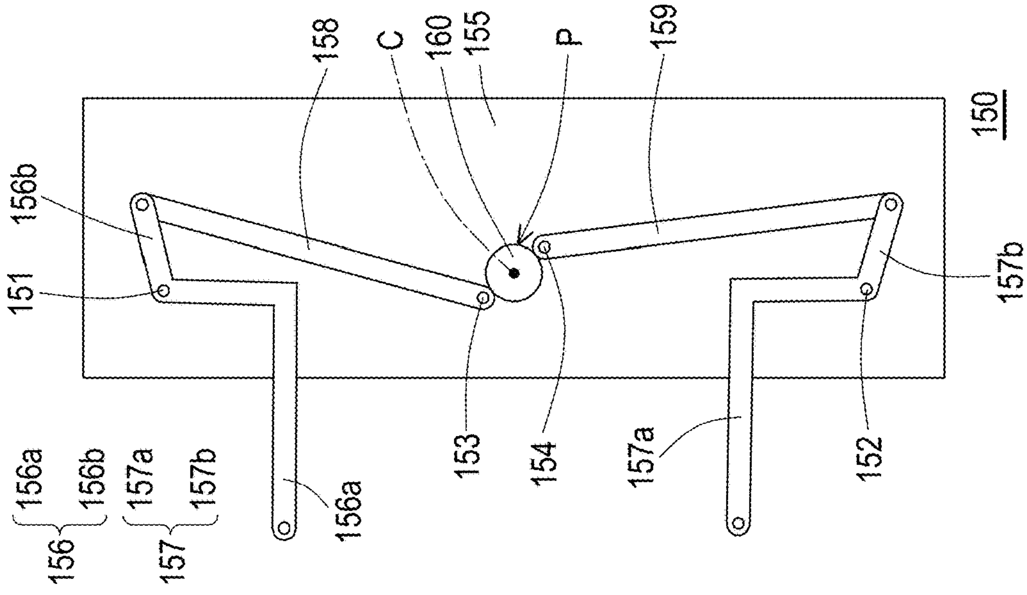
FIG. 7A is a schematic diagram of the support mechanism of FIG. 6 at a first point in time.

FIG. 7A is a schematic diagram of the support mechanism of FIG. 6 at a first point in time. FIG. 7B is a schematic diagram of the support mechanism of FIG. 6 at a second time point in time. FIG. 7C is a schematic diagram of the support mechanism of FIG. 6 at a third time point in time. The operating mechanism for the support mechanism 150 will be described as follows.

In this embodiment, the third axis 153 and the fourth axis 154 are adapted to rotate along the circumference P of the rotating member 160 so that the first linking member 156 and the second linking member 157 move close to or distant from each other.

Referring to FIG. 7A to FIG. 7C in sequence, specifically, when the user activates the unfolding mode, the rotating member 160 is driven by the second power source to rotate in a rotating direction (for example, the clockwise direction in FIGS. 7A to 7C). Then, the third axis 153 and the fourth axis 154 are driven to revolve around the center C of the circumference P.

Next, the third axis 153 drives the third linking member 158 to move, and the third linking member 158 drives the first linking member 156 to move, so that the first linking member 156 rotates about the first axis 151 as the rotating center. Meanwhile, the fourth axis 154 drives the fourth linking member 159 to move, and the fourth linking member 159 drives the second linking member 157 to move, so that the second linking member 157 rotates about the second axis 152 as the rotation center.

Thereby, the first linking member 156 and the second linking member 157 may move away from each other, in conjunction with the movement of the flexible display module 110 (FIG. 1B), and do not hinder the process when the flexible display module 110 moves out of the receiving trough 102 (FIG. 2). Since the first linking member 156 and the second linking member 157 are pivotally connected to the corresponding chain units 146 of the flexible display module 110 and may firmly support the flexible display module 110, preventing it from hanging down due to gravity or shaking due to external forces.

When the user activates the folding mode, the rotating member 160 is driven by the second power source to rotate in a direction (for example, the counterclockwise direction in FIGS. 7A to 7C) opposite to the aforementioned rotating direction, and the first linking member 156 and the second linking member 157 may move closer to each other as shown from FIG. 7C to FIG. 7A in sequence, in conjunction with the movement of the flexible display module 110, and do not hinder the process when the flexible display module 110 moves into the receiving trough 102.

The operating mechanism of the first linking member 156 and the second linking member 157 in the folding mode is similar to the aforementioned unfolding mode and will not be described repeatedly here.

In summary, in the display device of the disclosure, the flexible display module is provided with the chain assembly, and the conveying assembly is disposed in the frame and is able to drive the chain assembly to move. When the flexible display module is in the folding mode, the conveying mechanism drives the chain assembly to move in the folding direction, so that the flexible display module bendably moves into the receiving trough, and the flexible display module is folded in half in the receiving trough. When the flexible display module is in the unfolding mode, the conveying mechanism drives the chain assembly to move in the unfolding direction so that the flexible display module moves out of the receiving trough. This design combines sliding and folding mechanisms, allowing not only convenient folding and unfolding but also a local and smaller area of stretching or compression when the flexible display module is bending, thereby effectively reducing the bending radius of the display device and saving space.

In addition, the frame is provided with the support mechanism. The support mechanism is pivotally connected to the lateral side of the flexible display module, so as to strongly support and maintain the shape of the flexible display module when it is unfolded, thereby preventing the flexible display module from hanging down due to gravity or shaking by external forces.

What is claimed is:

1. A display device, comprising:

a frame, having a receiving trough;

a flexible display module, bendably folded in the receiving trough and having a lateral side;

a conveying mechanism, comprising a conveying assembly and a chain assembly, wherein the chain assembly is disposed on the flexible display module, and the conveying assembly is disposed on the frame and is adapted to drive the chain assembly to move; and a support mechanism, disposed on the frame and pivotally connected to the lateral side, when the flexible display module is in a folding mode, the conveying mechanism drives the chain assembly to move in a folding direction, so that the flexible display module bendably moves into the receiving trough in the folding direction, and the flexible display module is folded in half in the receiving trough, when the flexible display module is in an unfolding mode, the conveying mechanism drives the chain assembly to move in an unfolding direction opposite to the folding direction, so that the flexible display module moves out of the receiving trough in the unfolding direction, and the support mechanism supports the flexible display module so that the flexible display module extends perpendicularly to the unfolding direction.

2. The display device according to claim 1, wherein the lateral side comprises two ends and a central area between the two ends, the flexible display module has a first bending point and two second bending points, the first bending point is located in the central area, the two second bending points move between the two ends along the lateral side during folding or unfolding of the flexible display module relative to the frame.

3. The display device according to claim 1, the chain assembly comprises a carrier assembly and a plurality of chain units, the carrier assembly is disposed on a back side of the flexible display module and comprises a plurality of carrier units, the carrier units are rotatably connected in sequence, the chain units are rotatably connected in sequence and are respectfully fixed to the carrier units, and each of the chain units is provided with a driven gear.

4. The display device according to claim 3, the conveying assembly comprises a first gear, a second gear, a conveying belt, and a gear rack, the first gear and the second gear are separated from each other and rotatably disposed on the frame, the conveying belt is fitted on the first gear and the second gear, the gear rack is fixed to the conveying belt, engaged with the driven gear, and is movably disposed on the frame, and when the first gear drives the conveying belt to move, the flexible display module is driven by the conveying belt and the gear rack to move into the receiving trough in the folding direction or out of the receiving trough in the unfolding direction.

5. The display device according to claim 1, wherein the receiving trough has a central axis parallel to the folding direction, and the flexible display module moves into or out of the receiving trough symmetrically with respect to the central axis.

6. The display device according to claim 1, the flexible display module has a first area and a second area, the first area and the second area face away from the frame, the first area and the second area form a display region, an area of the display region is adapted to be changed as the flexible display module is folded or unfolded with respect to the frame.

7. The display device according to claim 1, further comprising a support mechanism, wherein the support mechanism comprises:

a fixing plate, fixed to the frame;

a first axis, a second axis, a third axis, and a fourth axis parallel to each other, wherein the first axis and the second axis are fixed on the fixing plate, the third axis and the fourth axis are adapted to move relative to the fixing plate; and a first linking member, a second linking member, a third linking member, and a fourth linking member, wherein the first linking member is pivotally connected to the chain assembly, the first axis, and the third linking member, the second linking member is pivotally connected to the chain assembly, the second axis, and the fourth linking member, the third linking member is pivotally connected to the third axis, and the fourth linking member is pivotally connected to the fourth axis, wherein the third axis and the fourth axis are adapted to rotate along a circumference, so that the first linking member and the second linking member move close to or distant from each other.

8. The display device according to claim 7, wherein when the flexible display module is in the folding mode, the first linking member and the second linking member are close to each other, and when the flexible display module is in the unfolding mode, the first linking member and the second linking member are distant from each other.

9. The display device according to claim 7, wherein a line connecting the third axis and the fourth axis passes through a center of the circumference, and a distance between the third axis and the fourth axis is constant.

10. The display device according to claim 7, the first linking member comprises a first sub-linking member and a second sub-linking member, the first sub-linking member is L-shaped and is connected between the chain assembly and the first axis, the second sub-linking member is connected between the first axis and the third linking member, the second linking member comprises a third sub-linking member and a fourth sub-linking member, the third sub-linking member is L-shaped and is connected between the chain assembly and the second axis, and the fourth sub-linking member is connected between the second axis and the fourth linking member.

* * * * *